TRANSISTOR TRIGGER CIRCUIT STABILIZATION

Filed June 4, 1958 2 Sheets-Sheet 1

INVENTOR
H. MANN
BY R. B. Ardis
ATTORNEY

TRANSISTOR TRIGGER CIRCUIT STABILIZATION

Filed June 4, 1958 2 Sheets-Sheet 2

INVENTOR
H. MANN
BY R. B. Ardis
ATTORNEY 2,964,655

TRANSISTOR TRIGGER CIRCUIT STABILIZATION

Henry Mann, Berkeley Heights, N.J., assignor to Bell Telephone Laboratories, Incorporated, New York, N.Y., a corporation of New York Filed June 4, 1958, Ser. No. 739,745

6 Claims. (Cl. 307—88.5)

This invention relates generally to amplitude comparison circuits and more particularly to two-stage regenerative transistor trigger circuits for generating an output pulse whenever the input signal rises above a predetermined level.

One object of the invention is to increase the accuracy with which the triggering potential of a two-stage regenerative transistor trigger circuit may be fixed.

Another and more particularly object is to prevent the triggering potential of such a circuit from drifting with temperature variations.

Still another object of the invention is to free the triggering potential of a two-stage regenerative transistor trigger circuit from dependence upon the gain of the first stage.

The invention is principally, although in its broader aspects not exclusively, applicable to the type of two-stage emitter-coupled transistor trigger circuit sometimes known as the Schmitt trigger circuit. In the transistor art, such a circuit includes a pair of transistors of like conductivity type, one regenerative feedback path intercoupling the emitter electrodes of the two transistors, and a second regenerative feedback path intercoupling the collector electrode of the first stage and the base electrode of the second. Application of a D.-C. signal pulse between the base and emitter electrodes of the first stage causes the circuit to shift state, producing a large shift in output voltage, whenever the input signal rises above a predetermined level. It is for this reason that the circuit is particularly useful as an amplitude comparator. For such a circuit to be accurate in comparing amplitudes in this manner, however, it is important that the triggering potential be independent of power supply voltages, transistor amplification factors, particularly in the first stage, and temperature variations.

In accordance with the present invention, the triggering point of a two-stage regenerative transistor amplitude comparison circuit is fixed with a particularly high degree of accuracy and stability by the combination of a first avalanche breakdown diode connected to fix the maximum collector voltage of the first stage when the first stage is conducting and a second avalanche breakdown diode connected to fix the maximum voltage drop between the collector electrode of the first stage and the base electrode of the second. Diodes of this type have a substantially constant voltage region in their reverse conduction characteristic for applied voltages in excess of a critical value (sometimes called the avalanche breakdown or zener voltage) and are disclosed in detail, for example, in United States Patent 2,714,702, issued August 2, 1955, to W. Shockley. When a direct voltage is applied biasing it in the reverse direction, an avalanche breakdown diode provides a high impedance for that portion of the voltage less than the breakdown value. For applied voltages in excess of the breakdown value, however, the diode provides a much lower impedance. The avalanche breakdown diode serves, therefore, as a substantially constant voltage device when reverse biased beyond its critical point and, as taught by the abovementioned Shockley patent, may be used to fix either a limit beyond which a voltage is not permitted to go or an actual voltage drop, depending upon whether or not the magnitude of the applied biasing voltage ever falls below the critical point.

The present invention goes beyond the teaching of the Shockley patent, however, in that it not only prevents the actual triggering point (i.e., the input signal level at which the circuit fires) of a two-stage regenerative amplitude comparison circuit from shifting with supply voltage and transistor current amplification factor variations but also prevents the triggering point of such a circuit from drifting with temperature. As pointed out in the article, "Silicon P-N Junction Alloy Diodes," by G. L. Pearson and B. Sawyer, appearing at page 1348 of the November 1952 issue of the Proceedings of the IRE, the breakdown voltage of an avalanche breakdown diode increases measurably with temperature. In the past, therefore, even if avalanche breakdown diodes were used in amplitude comparison circuits for stabilization purposes, the triggering points would still have tended to drift with temperature. In accordance with an important feature of the present invention, such drift is almost entirely eliminated, since even though the collector voltage of the first stage may drift with temperature, that drift is fully compensated by the action of the second breakdown diode. The avalanche breakdown voltage of the second diode also increases with temperature, causing the potential at the base electrode of the second stage to remain fixed regardless of temperature variations.

A more complete understanding of the invention may be obtained from a study of the following detailed description of one specific embodiment. In the drawings.

Figure 1:
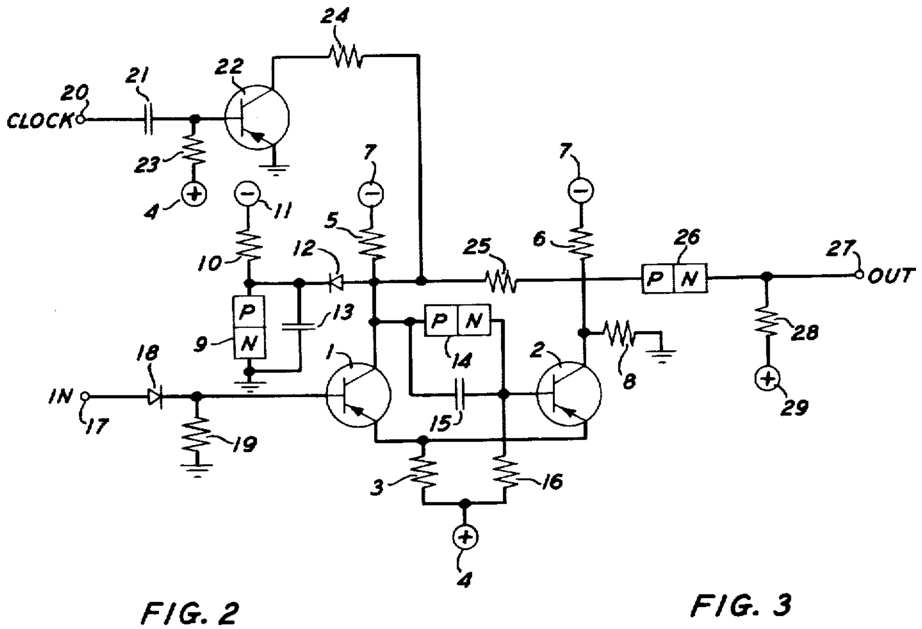
Fig. 1 is a schematic diagram of a specific two-stage regenerative transistor amplitude comparison circuit embodying the present invention.

The amplitude comparator illustrated in Fig. 1 is a two-stage regenerative trigger circuit containing a pair of transistors 1 and 2 of like conductivity type. These may be, for example, p-n-p junction transistors, as indicated in the drawing by the direction of the emitter arrows. The emitter electrodes of the two transistors 1 and 2 are connected directly together to form one regenerative feedback path, while the collector electrode of transistor 1 is connected to the base electrode of transistor 2 through a voltage dropping network to form another. The two emitter electrodes are connected through a resistor 3 to the positive terminal of a D.-C. supply source 4, and the two collector electrodes are connected through respective dropping resistors 5 and 6 to the negative terminal of a D.-C. supply source 7. The various D.-C. sources in Fig. 1 are shown as only single terminals in the interest of clarity, but it should be understood that the complete connection in each instance carries from the terminal through the source itself to ground. The collector electrode of transistor 2 is also returned to ground through a resistor 8.

Figure 2:
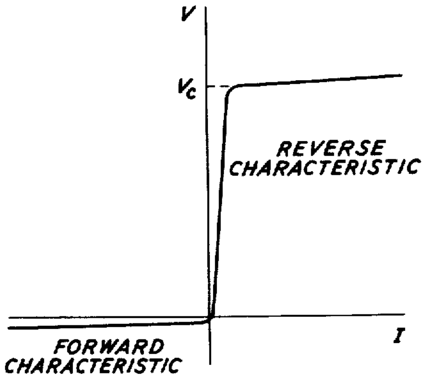
Fig. 2 illustrates the forward and reverse conduction characteristics of the avalanche breakdown diodes used in the embodiment of the invention shown in Fig. 1.

In accordance with an important feature of the present invention, the maximum negative potential the collector electrode of transistor 1 in Fig. 1 can reach while in its conducting state is limited by a network which includes an avalanche breakdown diode 9. Diode 9 is a p-n junction diode of the type disclosed in the above-noted Shockley patent and Pearson-Sawyer article, and has the type of current-voltage characteristic illustrated in Fig. 2. As shown, diode 9 has a relatively low impedance forward conducting characteristic, a relatively high impedance reverse conducting characteristic for applied voltages less than the critical value $V_c$, and a relatively low impedance reverse conducting characteristic for applied voltages in excess of $V_c$. For transistors of the illustrated conductivity type and D.-C. supply sources of the illustrated polarity, diode 9 has its cathode grounded and its anode returned through a resistor 10 to a negative D.-C. supply source 11 slightly less in magnitude than negative D.-C. source 7. The anode of diode 9 is also connected through an ordinary (i.e., non-breakdown) semiconductor diode 12 to the collector of transistor 1, and diode 9 is shunted by a bypass capacitor 13. Avalanche breakdown diode 9 is poled, in other words, for easy current flow (i.e., current flow in the forward conducting direction) in the direction opposite to that in which D.-C. sources 4 and 7 combine to send current through the internal collector-emitter paths of transistors 1 and 2. Diode 12 is poled for easy current flow from the collector of transistor 1 toward avalanche breakdown diode 9.

In accordance with another important feature of the invention, the voltage drop between the collector electrode of transistor 1 and the base electrode of transistor 2 is fixed by a second avalanche breakdown diode 14. Diode 14 is also of the p-n junction type and has the type of current-voltage characteristic illustrated in Fig. 2, but has an avalanche breakdown or critical voltage $V_c$ somewhat greater than that of breakdown diode 9. Breakdown diode 14 is connected in series in the regenerative feedback path between the collector of transistor 1 and the base of transistor 2 and has its cathode connected to the latter electrode. Diode 14 is poled, in other words, for easy current flow in the direction opposite to the direction of forward emitter current flow in transistor 2, since forward emitter current in the latter device flows into the emitter and out of the base toward the collector of transistor 1. Breakdown diode 14 is shunted by a bypass capacitor 15, and the base of transistor 2 is returned through a resistor 16 to positive D.-C. source 4.

Figure 3:
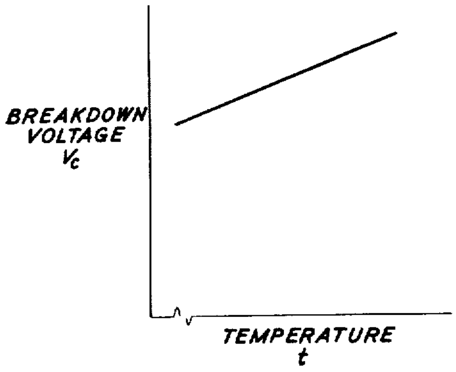
Fig. 3 illustrates the manner in which the breakdown voltage of an avalanche breakdown diode varies with temperature.

The manner in which the critical or breakdown voltage of avalanche breakdown diodes 9 and 14 increases substantially linearly with temperature is shown graphically in Fig. 3. As temperature rises, the breakdown voltages of both diodes rise by approximately the same amount. If an increase in the breakdown diode 9 causes the negative potential of the collector electrode of transistor 1 to rise, the present invention provides a compensating action and prevents that potential rise from affecting the potential of the base electrode of transistor 2. The breakdown voltage of diode 14 increases by a similar amount to hold the potential at the base of transistor 2 at an unvarying level.

Input signals, generally in the form of D.-C. pulses, are applied to the amplitude comparison circuit shown in Fig. 1 through an input terminal 17 which is connected through an ordinary semiconductor diode 18 to the base electrode of transistor 1. Diode 18 is poled for easy current flow in the direction from terminal 17 toward transistor 1 to pass only positive-going signal components and to prevent the input signal from retriggering the circuit to its original state on the downswing once it has fired the comparison circuit on the rise. A resistor 19 is returned to ground from the base electrode of transistor 1.

Rigidly accurate timing is provided in the embodiment of the invention illustrated in Fig. 1 by a so-called clock signal applied through a clock terminal 20. Terminal 20 is coupled through a capacitor 21 to the base electrode of a transistor 22. The base electrode of transistor 22 is returned to positive D.-C. source 4 through a resistor 23, while the emitter electrode is grounded. The collector of transistor 22 is connected directly to the collector of transistor 1 through a resistor 24.

Output may be taken from either the collector electrode of transistor 1 or the collector electrode of transistor 2 in Fig. 1, depending upon which polarity of output pulse is required. In Fig. 1, the output is taken, by way of example, from the collector of transistor 1, giving a negative-going pulse. The collector of transistor 1 is connected through the series combination of a resistor 25 and a third avalanche breakdown diode 26 to an output terminal 27. Breakdown diode 26 is poled for easy current flow from transistor 1 toward terminal 27. Terminal 27 is returned through a resistor 28 to a positive D.-C. supply source 29.

Figure 4:
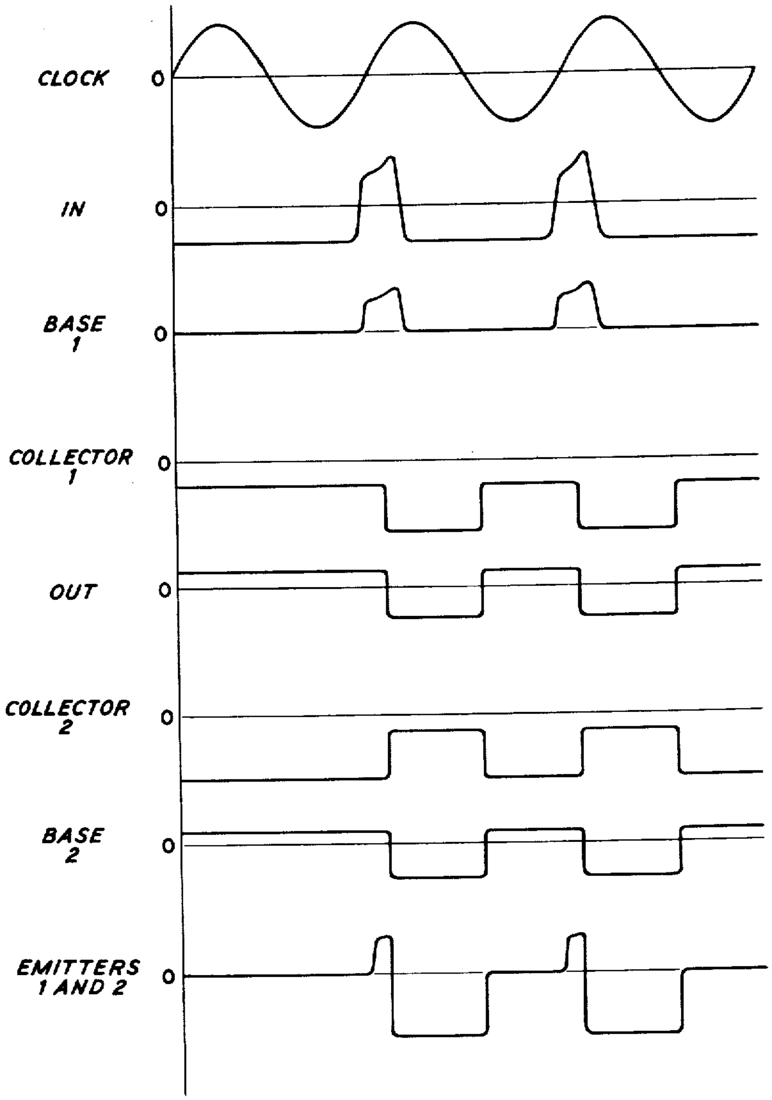
Fig. 4 shows a number of waveforms appearing at various points in the amplitude comparison circuit shown in Fig. 1.

The operation of the embodiment of the invention illustrated in Fig. 1 may best be explained with the aid of the waveforms shown in Fig. 4, where the first line shows the sinusoidal clock signal at clock terminal 20, the second line gives one example of an input signal that may be applied to input terminal 17, the third line shows the waveform at the base of transistor 1, the fourth line illustrates the waveform at the collector of transistor 1, the fifth line depicts the waveform at output terminal 27, the sixth line shows the waveform at the collector electrode of transistor 2, the seventh line shows the waveform at the base electrode of transistor 2, and the bottom line illustrates the waveform at the emitter electrodes of both transistors 1 and 2.

The sinusoidal clock signal shown in the top line of Fig. 4 is applied to clock terminal 20 in the embodiment of the invention shown in Fig. 1 to perform two important functions. In the first place, it prevents the trigger circuit from firing except during predetermined time intervals and, in the second place, it restores the trigger circuit to its original state after it has fired. The clock signal serves, in other words, to force the output pulses produced by the circuit to adhere to a rigid time pattern. It may, of course, be omitted in installations where such output pulse regularity is not required.

In the absence of an input signal at input terminal 17, the emitter-base junction of transistor 1 is forward biased and transistor 1 is in its conducting state. As shown in the fourth line of Fig. 4, the collector electrode of transistor 1 is less negative than it is when transistor 1 is in its non-conducting state, the actual potential being determined by the breakdown voltage of avalanche breakdown diode 9. The base of transistor 2 is positive with respect to the collector of transistor 1 by an amount equal to the breakdown voltage of avalanche breakdown diode 14, as shown in the second line from the bottom of Fig. 4. Since the emitter of transistor 2 is negative with respect to the base, as shown in the bottom line of Fig. 4, transistor 2 is non-conducting and the collector electrode of transistor 2 approaches the negative potential set by D.-C. source 7, as shown in the third line from the bottom of Fig. 4.

As long as the clock signal at clock terminal 20 is negative, the emitter-base junction of transistor 22 is forward biased, maintaining transistor 22 in its low impedance condition. Transistor 22 thus keeps the collector potential of transistor 1 from falling below the level established by the breakdown voltage of diode 9. When the clock signal goes positive, however, transistor 22 is switched to its high impedance state and the collector voltage of transistor 1 is free to fall.

When a positive-going signal pulse appears at input terminal 17, its negative portion is clipped by diode 18 in order to prevent the signal pulse itself from triggering the amplitude comparison circuit back to its original state on the downswing. The waveform appearing at the base electrode of transistor 1, therefore, is that shown in the third line of Fig. 4. When the base electrode of transistor 1 starts to go positive, the emitter electrodes of both transistors 1 and 2 follow, as shown in the bottom line of Fig. 4. When the emitter electrode of transistor 2 goes above the base potential of transistor 2, however, transistor 2 switches to its conducting state. At that same instant, the common emitter potential is slightly lowered. This action tends to switch transistor 1 to its non-conducting condition, thereby reducing both the collector current and the collector voltage of transistor 1. The initial drop in the collector potential of transistor 1 forces transistor 2 to conduct more heavily. The regenerative action continues until transistor 1 is shut off and transistor 2 is firmly in its conducting condition. In this manner, the collector potential of transistor 2 rises toward ground, as shown in the sixth line of Fig. 4, and the collector potential of transistor 1 becomes more negative, as shown in the fourth line of Fig. 4.

In the absence of clipping diode 18, the amplitude comparison circuit shown in Fig. 1 would retrigger to its original state when the input pulse returned to a slightly negative potential. Diode 18 prevents it from doing so, however, and the circuit is reset instead by the clock signal. When the trigger circuit has fired in the manner described, it is restored to its original state by the negative portion of the clock waveform. When the clock goes negative, transistor switch 22 closes, forcing the collector of transistor 1 to rise toward ground. Regenerative action switches transistor 1 back to its conducting state and transistor 2 back to its non-conducting state, as illustrated by the collector voltage waveforms shown in the fourth and sixth lines of Fig. 4. The amplitude comparison circuit is then in condition to be triggered by the next signal pulse as soon as its amplitude increases above the predetermined value.

Since the trigger circuit illustrated in Fig. 1 fires as soon as the emitter electrodes of transistors 1 and 2 rise above the base potential of transistor 2, the accuracy of its amplitude comparison action depends upon the accuracy with which the base potential of transistor 2 can be fixed. The base potential of transistor 2 is dependent, however, upon the collector potential of transistor 1. In accordance with a feature of the invention, therefore, the maximum collector voltage of transistor 1 during periods of conduction is fixed by avalanche breakdown diode 9. The voltage applied by D.-C. source 11 is in excess of the breakdown voltage of diode 9, causing the anode of diode 9 to remain below ground precisely at the breakdown voltage. When transistor 1 is non-conducting, its collector electrode is isolated from breakdown diode 9 by diode 12. When transistor 1 is conducting, however, its collector potential tends to rise toward ground, causing diode 12 to conduct and clamping the potential of the collector of transistor 1 to the negative value fixed by avalanche breakdown diode 9. The collector voltage of transistor 1 while transistor 1 is conducting is thus made independent of the gain of that stage and, since the triggering potential of the amplitude comparison circuit is dependent upon that voltage, it too is made independent of the gain of the first stage.

As pointed out in the above-mentioned article by Pearson and Sawyer, the breakdown voltage of a device like avalanche breakdown diode 9 varies with temperature. The general nature of this variation is illustrated in Fig. 3 of the drawings. With diode 9 alone, therefore, the trigger circuit illustrated in Fig. 1 is still not completely stabilized against variations in the triggering point. In accordance with another feature of the invention, the maximum voltage drop between the collector electrode of transistor 1 and the base electrode of transistor 2 is fixed at all times by avalanche breakdown diode 14. As shown in the second line from the bottom of Fig. 4, the base of transistor 2 is positive with respect to the collector of transistor 1 by an amount equal to the avalanche breakdown voltage of diode 14. Diode 14 also has the breakdown voltage versus temperature characteristic illustrated in Fig. 3, and serves to compensate for the effect of temperature variations on the triggering point of the circuit.

The base electrode of transistor 2 thus remains at a potential when transistor 1 is conducting which remains accurately fixed, regardless of temperature variations or variations in the gain of transistor 1. The collector voltage of transistor 1 is rendered independent of gain variations by breakdown diode 9. Diode 9 does not, however, by itself make the base voltage of transistor 2 independent of temperature variations. That end is accomplished through the combined effects of diodes 9 and 14. When the temperature rises, for example, the breakdown voltages of both diodes increase by substantially the same amount. The collector electrode of transistor 1 is more negative than before, but the drop across diode 14 is larger than before, keeping the base electrode of transistor 2 accurately at its original potential. Since the circuit fires when the emitter electrodes of the two transistors 1 and 2 become positive with respect to the base electrode of transistor 2, the triggering potential itself is fixed with like accuracy and the effectiveness of the circuit as an amplitude comparator is assured.

Output pulses may be taken in the embodiment of the invention illustrated in Fig. 1 either from the collector of transistor 1 or the collector of transistor 2, depending upon the polarity required. As shown in the fourth and sixth lines of Fig. 4, those at the collector of transistor 1 are negative-going while those at the collector of transistor 2 are positive-going. Fig. 1 shows a circuit arrangement for taking the output from transistor 1. The waveform at the collector electrode of transistor 1 has a large negative D.-C. component which is largely removed by the action of breakdown diode 26 and D.-C. source 29. When the trigger circuit is in its normal condition, with transistor 1 conducting and transistor 2 non-conducting, output terminal 27 rests at a small positive voltage determined by dropping resistor 28 and D.-C. source 29. When the collector electrode of transistor 1 goes highly negative in response to an input signal in excess of the triggering point, the reverse bias on breakdown diode 26 makes that diode conduct, giving the waveform illustrated in the fifth line of Fig. 4.

It is to be understood that the above-described arrangement is illustrative of the application of the principles of the invention. Numerous other arrangements may be devised by those skilled in the art without departing from the spirit and scope of the invention.

What is claimed is:

1. A stabilized trigger circuit for generating an output pulse whenever the input signal rises above a predetermined level which comprises a pair of transistors each having an emitter electrode, a collector electrode, and a base electrode, a signal input path intercoupling the base and emitter electrodes of a first of said transistors, means including a first p-n junction diode having a substantially constant voltage region in its reverse conduction characteristic for applied voltages in excess of a critical value connected by switching means between the collector electrode of said first transistor and a point of reference potential to limit the maximum collector voltage excursions of said first transistor when said first transistor is conducting, and means including a second p-n junction diode having a substantially constant voltage region in its reverse conduction characteristic for applied voltages in excess of a critical value connected between the collector electrode of said first transistor and the base electrode of the second of said transistors to limit the maximum voltage drop between the collector electrode of said first transistor and the base electrode of said second transistor, said diodes each having a corresponding terminal coupled to the collector electrode of said first transistor when said first transistor is conducting, said diodes thereby cooperating to reduce the effect of temperature variation upon the triggering point of said circuit.

2. A stabilized trigger circuit for generating an output pulse whenever the input signal rises above a predetermined level which comprises a pair of transistors each having an emitter electrode, a collector electrode, and a base electrode, a signal input path intercoupling the base and emitter electrodes of a first of said transistors, a first regenerative feedback path interconnecting the collector electrode of said first transistor and the base electrode of the second of said transistors, a second regenerative feedback path interconnecting the emitter electrodes of both of said transistors, means including a first avalanche breakdown diode connected by switching means between the collector electrode of said first transistor and a point of reference potential to limit the maximum collector voltage excursions of said first transistor when said first transistor is conducting, and means including a second avalanche breakdown diode connected in said first feedback path to limit the maximum voltage drop between the collector electrode of said first transistor and the base electrode of said second transistor, said diodes each having a corresponding terminal coupled to the collector electrode of said first switch when said first switch is conducting, said diodes thereby cooperating to reduce the effect of temperature variation upon the triggering point of said circuit.

3. A stabilized trigger circuit for generating an output pulse whenever the input signal rises above a predetermined level which comprises a pair of transistors each having an emitter electrode, a collector electrode, and a base electrode, a signal input path intercoupling the base and emitter electrodes of a first of said transistors, a first regenerative feedback path interconnecting the collector electrode of said first transistor and the base electrode of the second of said transistors, a second regenerative feedback path interconnecting the emitter electrodes of both of said transistors, a source of direct potential poled in the direction of forward emitter current flow in both of said transistors connected between the emitter and collector electrodes of both of said transistors, means including a first avalanche breakdown diode poled oppositely to said source of direct potential connected by a diode between the collector electrode of said first transistor and a point of reference potential to limit the maximum collector voltage excursions of said first transistor when said first transistor is conducting, and means including a second avalanche breakdown diode poled oppositely to the direction of forward emitter current flow in said second transistor connected in said first feedback path to limit the maximum voltage drop between the collector electrode of said first transistor and the base electrode of said second transistor, said avalanche breakdown diodes each having a corresponding terminal coupled to the collector electrode of said first transistor when said first transistor is conducting, said diodes thereby cooperating to reduce the effect of temperature variation upon the triggering point of said circuit.

4. A stabilized trigger circuit for generating an output pulse whenever the input signal rises above a predetermined level which comprises a pair of transistors of like conductivity type each having an emitter electrode, a collector electrode, and a base electrode, a signal input path intercoupling the base and emitter electrodes of a first of said transistors, a first regenerative feedback path interconnecting the collector electrode of said first transistor and the base electrode of the second of said transistors, a second regenerative feedback path interconnecting the emitter electrodes of both of said transistors, a source of direct potential poled in the direction of forward emitter current flow in both of said transistors connected between the emitter and collector electrodes of both of said transistors, means to limit the maximum collector voltage excursion of said first transistor when said first transistor is conducting including a serially connected combination of a resistor and a first avalanche breakdown diode poled oppositely to said source of direct potential connected between said source of direct potential and a point of reference potential, a diode poled to present a low impedance path between its terminals when said first transistor is conducting coupling the collector electrode of said first transistor to said first avalanche breakdown diode, and means including a second avalanche breakdown diode poled oppositely to the direction of forward emitter current flow in said second transistor connected in said first feedback path to limit the maximum voltage drop between the collector electrode of said first transistor and the base electrode of said second transistor, said avalanche breakdown diodes each having a corresponding terminal coupled to the collector of said first transistor when said first transistor is conducting, said diodes thereby cooperating to reduce the effect of temperature variation upon the triggering point of said circuit.

5. A stabilized trigger circuit for generating an output pulse whenever the input signal rises above a predetermined level which comprises a pair of transistor switches, a signal input path connected to a first of said switches, means for rendering said switches operative in either a relatively high conduction region or a relatively nonconduction region in response to signals appearing in said input path, means including a first avalanche breakdown diode connected to fix the maximum collector voltage of said first switch when said first switch is operative in said relatively high conduction region, and means including a second avalanche breakdown diode connected to fix the maximum voltage drop between the collector electrode of said first switch and the base electrode of the second of said switches, said diodes each having a corresponding terminal coupled to the collector electrode of said first switch when said first switch is operative in said relatively high conduction region, and said diodes being poled to reduce the effect of temperature variation upon the triggering point of said circuit.

6. A stabilized trigger circuit for generating an output pulse whenever the input signal rises above a predetermined level which comprises a pair of transistor switches, a pair of cross-coupling regenerative feedback paths interconnecting said switches, a signal input path connected to a first of said switches, means for rendering said switches operative in either a relatively high conduction region or a relatively nonconduction region in response to signals appearing in said input path, means including a first avalanche breakdown diode connected to limit the maximum collector voltage excursions of said first switch when said first switch is operative in said relatively high conduction region, and means including a second avalanche breakdown diode connected in one of said feedback paths to limit the maximum voltage drop between the collector electrode of said first switch and the base electrode of the second of said switches, said diodes each having a corresponding terminal coupled to the collector electrode of said first switch when said first switch is operative in said relatively high conduction region, and said diodes being poled to reduce the effect of temperature variation upon the triggering point of said circuit.

References Cited in the file of this patent

UNITED STATES PATENTS

| | | |
|---|---|---|
| 2,770,732 | Chong | Nov. 13, 1956 |
| 2,830,257 | Denz | Apr. 8, 1958 |
| 2,840,727 | Guggi | June 24, 1958 |
| 2,880,330 | Linvill et al. | Mar. 31, 1959 |
| 2,892,103 | Scarbrough | June 23, 1959 |

FOREIGN PATENTS

| | | |
|---|---|---|
| 1,122,425 | France | May 22, 1956 |